(12) United States Patent
Aichele

(10) Patent No.: US 11,973,328 B2
(45) Date of Patent: Apr. 30, 2024

(54) CABLE CLASPING DEVICE

(71) Applicant: AICHELE AND ASSOCIATES, LLC, Brentwood, TN (US)

(72) Inventor: Natalie Aichele, Brentwood, TN (US)

(73) Assignee: AICHELE AND ASSOCIATES, LLC, Brentwood, TN (US)

( * ) Notice: Subject to any disclaimer, the term of this patent is extended or adjusted under 35 U.S.C. 154(b) by 0 days.

(21) Appl. No.: 17/868,592

(22) Filed: Jul. 19, 2022

(65) Prior Publication Data

US 2024/0030693 A1 Jan. 25, 2024

(51) Int. Cl.
| | |
|---|---|
| *H02G 15/007* | (2006.01) |
| *A47B 21/06* | (2006.01) |
| *F16L 3/00* | (2006.01) |
| *H02G 3/32* | (2006.01) |
| *H05K 5/06* | (2006.01) |
| *H05K 7/14* | (2006.01) |

(52) U.S. Cl.
CPC ............. *H02G 15/007* (2013.01); *H02G 3/32* (2013.01); *A47B 21/06* (2013.01); *F16L 3/00* (2013.01); *H05K 5/069* (2013.01); *H05K 7/14* (2013.01)

(58) Field of Classification Search
CPC ........ H02G 15/007; H02G 3/32; H02G 3/081; H05K 5/069; H05K 7/14; F16L 3/00; F16L 3/26; A47B 21/06
See application file for complete search history.

(56) References Cited

U.S. PATENT DOCUMENTS

| | | | | |
|---|---|---|---|---|
| 4,145,103 A | * | 3/1979 | Knowles | H01R 12/675 439/400 |
| 5,224,674 A | * | 7/1993 | Simons | A61M 5/1418 604/80 |
| 5,569,882 A | * | 10/1996 | Yokoyama | H02G 15/003 174/76 |
| 5,691,508 A | * | 11/1997 | Radliff | H02G 15/113 439/399 |
| 5,725,185 A | * | 3/1998 | Auclair | H02G 3/32 248/74.1 |
| 5,933,563 A | | 8/1999 | Schaffer et al. | |
| D913,776 S | | 3/2021 | Kohli et al. | |
| 2004/0135039 A1 | * | 7/2004 | Reichert | F16L 3/223 248/68.1 |
| 2011/0252605 A1 | | 10/2011 | Rothbaum et al. | |
| 2020/0354185 A1 | | 11/2020 | Kohli et al. | |
| 2020/0390237 A1 | * | 12/2020 | Cvek | A47B 21/06 |

FOREIGN PATENT DOCUMENTS

| | | | |
|---|---|---|---|
| CN | 204022111 U | * | 12/2014 |
| CN | 205724790 U | * | 11/2016 |

* cited by examiner

*Primary Examiner* — Tan Le
(74) *Attorney, Agent, or Firm* — Sagacity Legal, PLLC

(57) ABSTRACT

A cable clasping device includes a body and a mounting system. The body defines one or more retention structures configured to receive a section of a cable to retentively secure and lock the section of the cable with respect to the body. The mounting system is configured to mount the body against a surface to retain the section of the cable against the surface.

10 Claims, 9 Drawing Sheets

CABLE CLASPING DEVICE

BACKGROUND OF THE INVENTION

It is a common practice for cords and cables (for example an electrical cable) to be left hanging freely from an apparatus or a device, such as an electrical device, whether or not the apparatus or the device is in use. Such loose cords can be a safety hazard. A mishandling of a dangling cable (for example, by fiddling with the dangling cable or by purposefully or accidentally pulling the dangling cable) can result in substantial misplacement and movement of the cord and consequently movement of the connected device, possibly resulting in damage to the device, a fire hazard, or harm to a person or other living being.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention and explain various principles and advantages of those embodiments.

Figure 1B:
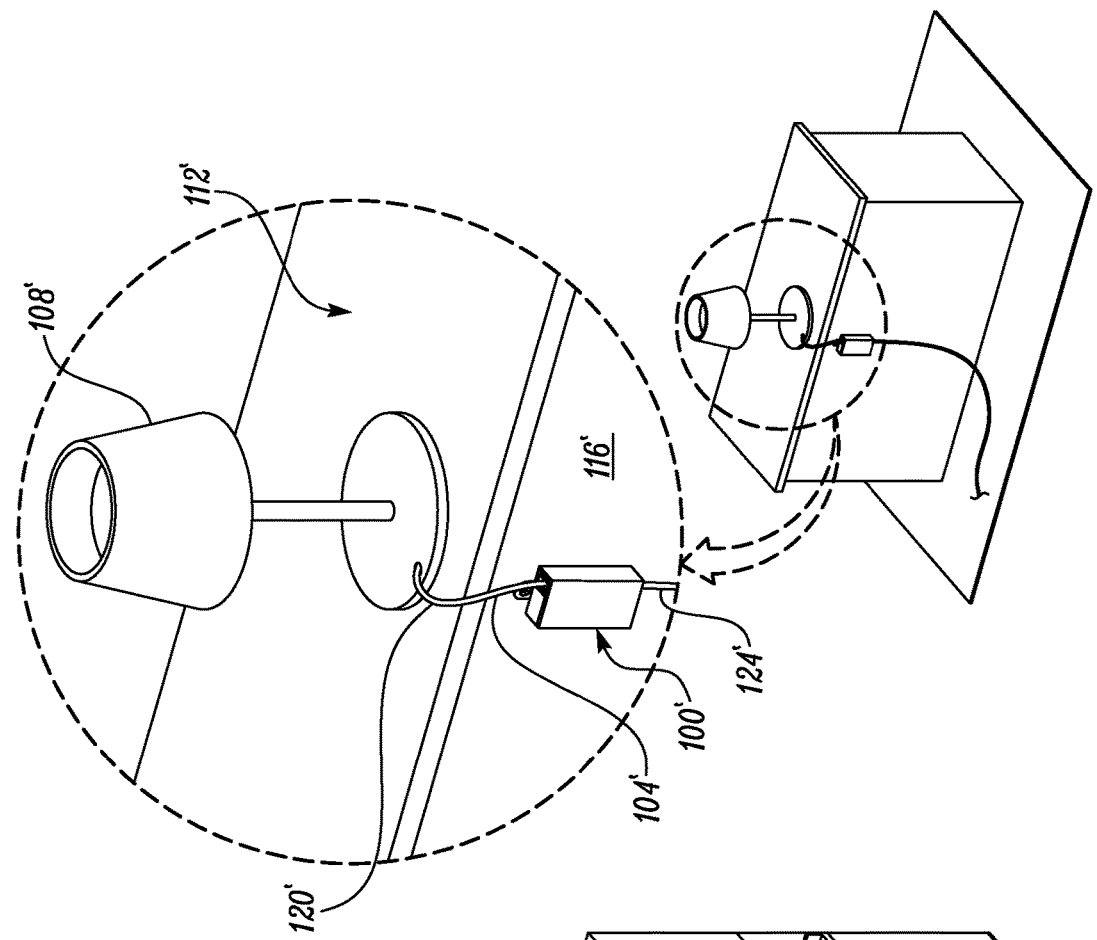
FIGS. 1A and 1B are pictorial views illustrating exemplary applications of cable clasping devices, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments.

The apparatus and method components have been represented where appropriate by conventional symbols in the drawings, showing only those specific details that are pertinent to understanding the embodiments so as not to obscure the description with details that will be readily apparent to those of ordinary skill in the art having the benefit of the description herein.

DETAILED DESCRIPTION OF THE INVENTION

The embodiments described herein are related to a cable clasping device that facilitates retention of a section of a cable against a surface so as to prevent misplacement of the cable with respect to the surface. The cable can extend from an apparatus (for example, an electrical appliance), and, therefore, along with helping retain the section of the cable against the surface, the cable clasping device also prevents a misplacement of and/or a damage to the apparatus.

In one aspect, a cable clasping device is described. The cable clasping device includes a body and a mounting system. The body defines one or more retention structures configured to receive a section of a cable to retentively secure and lock the section of the cable with respect to the body. The mounting system is configured to mount the body against a surface to retain the section of the cable against the surface.

Reference will now be made in detail to specific embodiments or features, examples of which are illustrated in the accompanying drawings. Generally, corresponding reference numbers may be used throughout the drawings to refer to the same or corresponding parts, for example, 1, 1', 1", 101 and 201 could refer to one or more comparable components used in the same and/or different depicted embodiments.

Figure 1A:
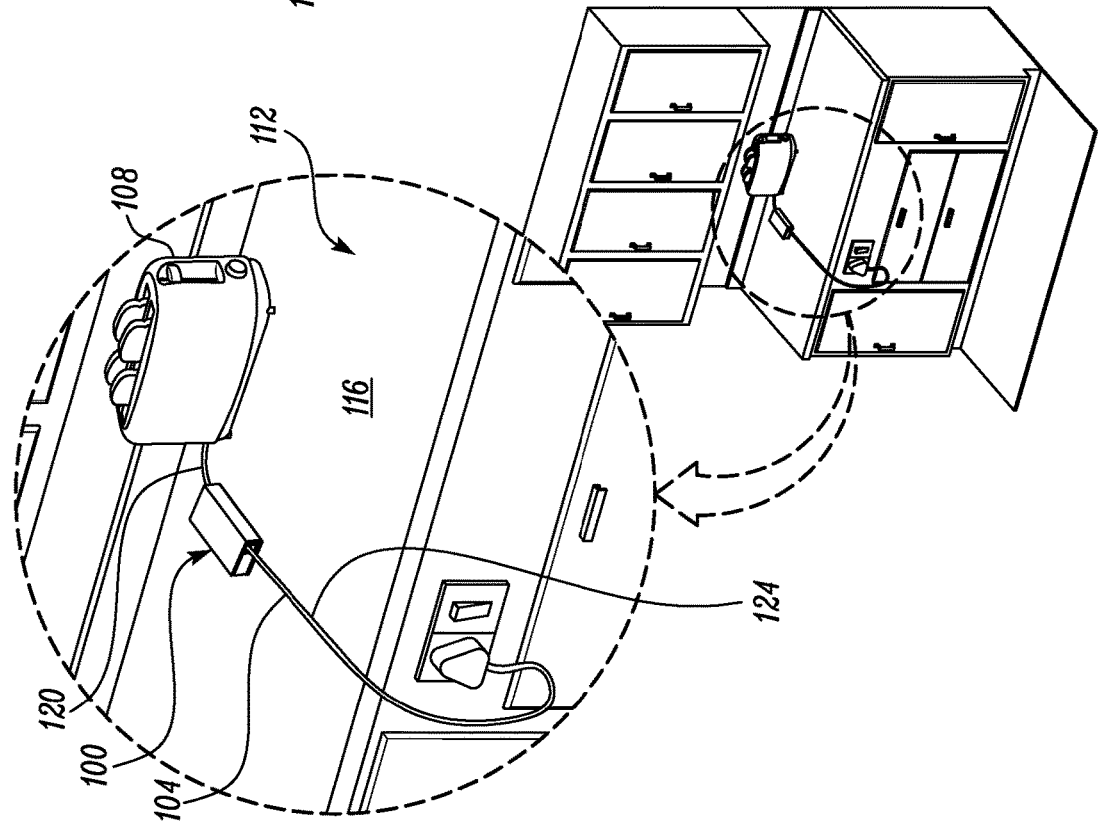

Referring to FIGS. 1A and 1B, exemplary cable clasping devices 100, 100' in their respective exemplary applications are shown. The cable clasping devices 100, 100' are applied to prevent misplacement of a cable with respect to a surface and/or to prevent a misplacement of or a damage to an apparatus from which the cable extends. The term 'misplacement' when used with respect to the cable and/or the apparatus shall be understood as preventing any excessive movement of the section of the cable and/or the apparatus, either of which can result in damage to the cable and/or the apparatus. Many applications of the cable clasping devices 100, 100', such as those depicted in FIGS. A and 1B can be contemplated, and those described in FIGS. 1A and 1B are solely exemplary.

Figure 2A:
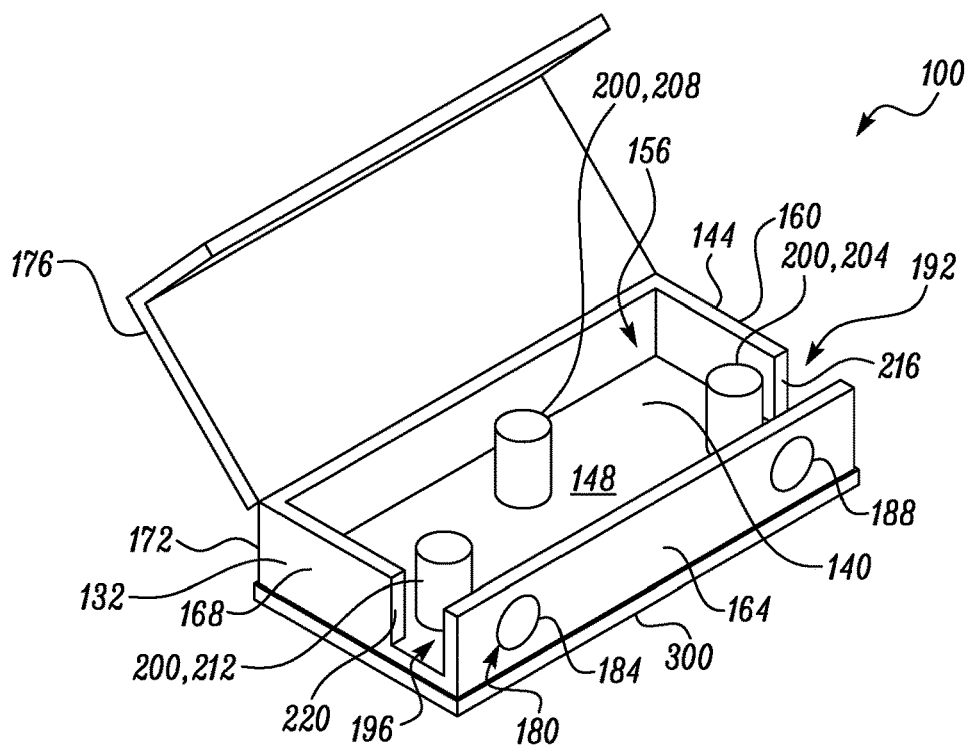
FIGS. 2A through 2E are close up views of the cable clasping device of FIG. 1A illustrating exemplary structural and configurational details of said cable clasping device, in accordance with some embodiments.
Figure 2B:
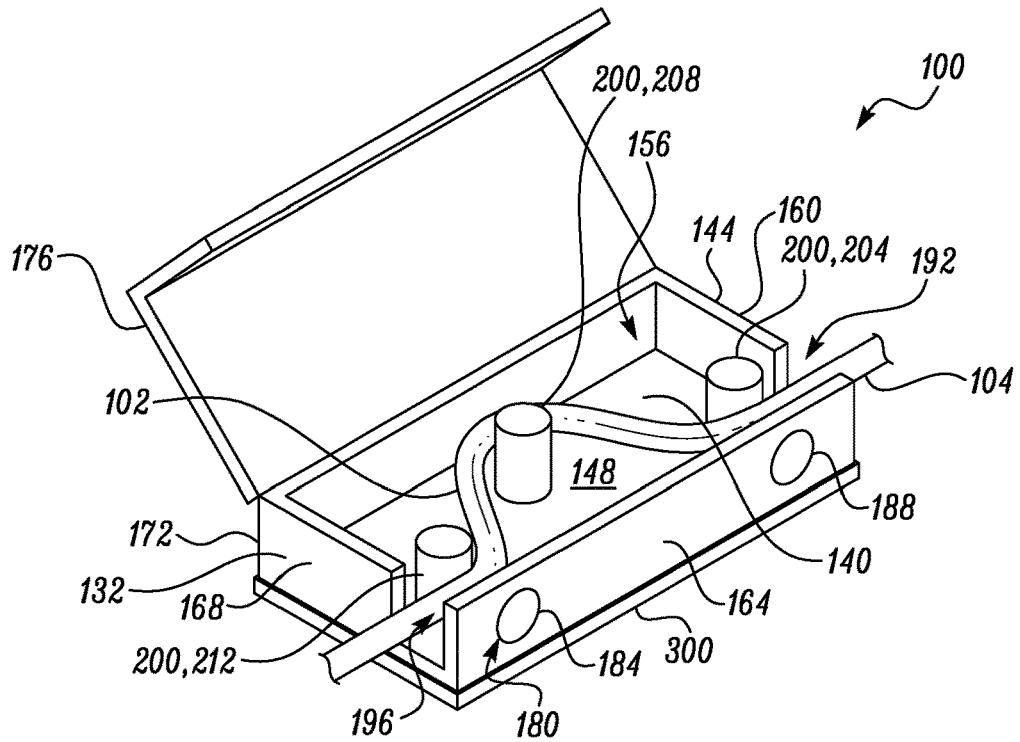

In FIG. 1A, for example, the cable clasping device 100 is applied to clasp a section 102 of a cable 104 (see section 102 in FIG. 2B) that extends from an apparatus 108. As an example, the apparatus 108 is an electrical appliance such as a toaster. As exemplarily shown in FIG. 1A, the apparatus 108 is placed over a counter top 112, which is customarily found in a commercial and/or a household kitchen, and the cable clasping device 100 is mounted and retained over a working surface 116 of the counter top 112 and receives the section 102 of the cable 104 disposed in close relative proximity to the apparatus 108 so as to clasp the section 102 of the cable 104. In that manner, the section 102 of the cable 104 is retained against the working surface 116 of the counter top 112.

In FIG. 1B, for example, the cable clasping device 100' is applied to clasp a section (similar to section 102, see FIG. 2B) of a cable 104' that extends from another apparatus 108'. As an example, the apparatus 108' is an electrical appliance such as a table lamp. As exemplarily shown in FIG. 1B, the apparatus 108' is placed over a dresser table 112' and the cable clasping device 100' is mounted and retained onto a side surface 116' of the dresser table 112' and receives the section of the cable 104' disposed in close relative proximity to the apparatus 108' so as to clasp said section of the cable 104'. In that manner, said section of the cable 104' is retained against the side surface 116' of the dresser table 112'.

In each of the aforementioned example applications, the cable clasping devices 100, 100' receive and/or clasp a section (for example, section 102) of the corresponding cables 104, 104' such that the corresponding cables 104, 104' are divided into corresponding proximal cable portions 120, 120' and corresponding distal cable portions 124, 124'. The proximal cable portions 120, 120' are disposed relatively proximally to the corresponding apparatuses 108, 108', while the distal cable portions 124, 124' are disposed relatively distally to the corresponding apparatuses 108, 108'. Because the cable clasping devices 100, 100' clasp the corresponding sections of the corresponding cables 104, 104' and retain the same against the corresponding surfaces 116, 116', the cable clasping devices 100, 100' help prevent a misplacement of the corresponding sections of the corresponding cables 104, 104' and/or prevent a damage to the corresponding apparatus 108, 108' when the corresponding cables 104, 104' are mishandled or inadvertently pulled at from their corresponding distal cable portions 124, 124'.

Although the cable clasping device 100 is illustrated to be exemplarily applied on the working surface 116 and the cable clasping device 100' is illustrated to be exemplarily applied on the side surface 116', it will be appreciated that said applications of cable clasping devices 100, 100' can be reversed. In other words, the cable clasping device 100 can be applied on the side surface 116', while the cable clasping device 100' can be applied on the working surface 116. In particular, it will be appreciated that the cable clasping device 100 is not restricted to be used on a horizontal surface, such as the working surface 116, but it can also be suitably used on any other surface, such as a vertical surface, an inclined surface, a curved surface, or an irregular surface. Likewise, it will be appreciated that the cable clasping device 100' is also not restricted to be used on a vertical surface, such as the side surface 116', but it can also be suitably used on any other surface, such as a horizontal surface, an inclined surface, a curved surface, or an irregular surface. Features of the cable clasping devices 100, 100' shall be described in the forthcoming description. As the description proceeds, it will become apparent that there are also differences between the cable clasping devices 100, 100'. Said differences can be optional differences. All the features of the cable clasping devices 100, 100' fall within the ambit of the claimed subject matter.

Referring to FIGS. 2A through 2E, and also in conjunction with FIGS. 5A through 5D, the cable clasping device 100 is described. The description corresponding to the cable clasping device 100 is equitably applicable to the cable clasping device 100', as well. The cable clasping device 100 includes a body 132 and a mounting system 136. The mounting system 136 is best shown in FIGS. 5A through 5D. The body 132 defines a base portion 140 and a wall portion 144. As an example, the base portion 140 includes a rectangular profile and takes the form of a planarly extending flat structure that defines a first surface 148 and a second surface 152 (see FIGS. 5A and 5D). The base portion 140 can include other shapes or profiles, such as a hexagonal profile, or an octagonal profile, or any other shaped profile, or one that inherently adds aesthetic or decorative value to the cable clasping device 100 and which is more pleasing to look at and/or more ergonomic to hold. The second surface 152 is defined oppositely to the first surface 148.

The wall portion 144 at least partly surrounds the base portion 140 and extends upright with respect to the base portion 140 to define a recess 156 within the body 132. More particularly, the wall portion 144 defines a first wall portion 160, a second wall portion 164, a third wall portion 168, and a fourth wall portion 172, all combinedly surrounding the base portion 140 such that together the first wall portion 160, the second wall portion 164, the third wall portion 168, and the fourth wall portion 172, in conjunction with the first surface 148, define the recess 156. Given the aforesaid rectangular profile of the base portion 140, the body 132 and/or to the cable clasping device 100 defines a cuboidal structure, although the cable clasping device 100 can include various other profiles.

The cable clasping device 100 also includes a gate portion 176. The gate portion 176 is pivotably coupled to the body 132—for example, the gate portion 176 is hinged to the fourth wall portion 172 (by use of a suitable mechanism which is now known or in the future developed) to swing back and forth with respect to the fourth wall portion 172. In so doing, the gate portion 176 is movable between a closed state (see FIG. 2E) and an opened state (see FIGS. 2A and 2B) with respect to the recess 156—where, in the opened state, the gate portion 176 opens the recess 156, and, in the closed state, the gate portion 176 closes the recess 156. During an application of the cable clasping device 100, the gate portion 176 can be moved to the closed state to enclose the section 102 of the cable 104 within the recess 156 and/or moved to the opened state to gain access to the section 102 of the cable 104 accommodated or passing through the recess 156.

In some embodiments, the cable clasping device 100 includes a fastening mechanism 180 to retain the gate portion 176 in the closed state. In some embodiments, the fastening mechanism 180 includes magnetic fastening elements 184, 188. As exemplarily shown, the magnetic fastening elements 184, 188 are arranged on the second wall portion 164 of the body 132 against which the gate portion 176 is abutted to or is brought in contact with such that a fastening between the gate portion 176 and the second wall portion 164 is attained by magnetic force. Variations to such a mechanism can be contemplated by someone skilled in the art. Further, various other types of fastening mechanisms, such as a snap-fit mechanism or a threadable mechanism, or any other mechanism now known or in the future developed, can also be contemplated.

The body 132 also defines one or more openings in one or more of the base portion 140, the wall portion 144, and the gate portion 176. As an example, the body 132 defines two openings—a first opening 192 and a second opening 196. The first opening 192 and the second opening 196 are formed in the wall portion 144 of the body 132, and, more particularly, the first opening 192 and the second opening 196 are respectively formed in the first wall portion 160 and the third wall portion 168 of the body 132. In the illustrated example of FIGS. 2A through 2E, both the first opening 192 and the second opening 196 are formed relatively closer towards the second wall portion 164 than to the fourth wall portion 172. The openings 192, 196 can also be formed elsewhere along the extents of the first wall portion 160 and the third wall portion 168, respectively, based upon need or the type of application that the cable clasping device 100 is employed in.

The body 132 defines one or more retention structures 200 configured to receive the section 102 of the cable 104 to retentively secure and lock the section 102 of the cable 104 with respect to the body 132. The retention structures 200 are arranged on the first surface 148 and within the recess 156 to be accommodated within the recess 156. As an example, the retention structures 200 include one or more protrusions extending outwards from the base portion 140 (or from the first surface 148 of the base portion 140). In the illustrated embodiments of FIGS. 2A through 2E, the retention structures 200 exemplarily include three protrusions—for example, a first protrusion 204, a second protrusion 208, and a third protrusion 212, each extending from the base portion 140. Although three protrusions 204, 208, 212 are described, a higher or a lower number of protrusions can be provided. The protrusions 204, 208, 212 extend exemplarily uprightly and/or linearly with respect to the first surface 148, although, in some cases, one or more of the protrusions 204, 208, 212 can extend angularly with respect to the first surface 148.

The protrusions 204, 208, 212 include a cross-sectional area which is circular, and thus the protrusions 204, 208, 212 are cylindrically shaped. It is however possible for said protrusions 204, 208, 212 to include a different cross-sectional area, such as a polygonal cross-sectional area, an elliptical cross-sectional area, or an irregular cross-sectional area. A cross-sectional area of one protrusion can also differ from a cross-sectional area of another protrusion. Alternatively, the cross-sectional areas of all protrusions 204, 208, 212 can be the same, in certain cases. In some embodiments, it is possible for the cross-sectional area of one or more of the protrusions 204, 208, 212 to vary as they extend outwards and/or away from the first surface 148.

The protrusions 204, 208, 212 are arranged in a non-linear manner on the first surface 148 of the base portion 140 and span out between the first wall portion 160 and the third wall portion 168, as shown. As an example, the protrusions 204, 208, 212 are arrayed in at least one of a zig-zag manner and/or an irregular manner on the base portion 140 from a side of the first wall portion 160 towards the third wall portion 168. FIGS. 2A through 2E illustrate an exemplarily layout or arrangement of the protrusions 204, 208, 212 in a zig-zag manner. Such non-linear arrangement of the protrusions 204, 208, 212 help the retention structures 200 define a non-linear pathway into which the section 102 of the cable 104 is received during use or application of the cable clasping device 100. In some embodiments, the non-linear pathway includes or corresponds to a zig-zag pathway—see pathway through which the section 102 of the cable 104 is routed in FIGS. 2B and 2C. The zig-zag pathway allows or enables the section 102 of the cable 104 to acquire one or more bends when the section 102 of the cable 104 is received in the recess 156 and around the protrusions 204, 208, 212, in turn causing the section 102 of the cable 104 to be retentively secured and locked with respect to the body 132. In alternative embodiments, the openings 192, 196 can be respectively formed on the second wall portion 164 and the fourth wall portion 172. In such a case, the arrangement of the protrusions 204, 208, 212 can accordingly change to span out between the second wall portion 164 and the fourth wall portion 172.

Figure 2C:
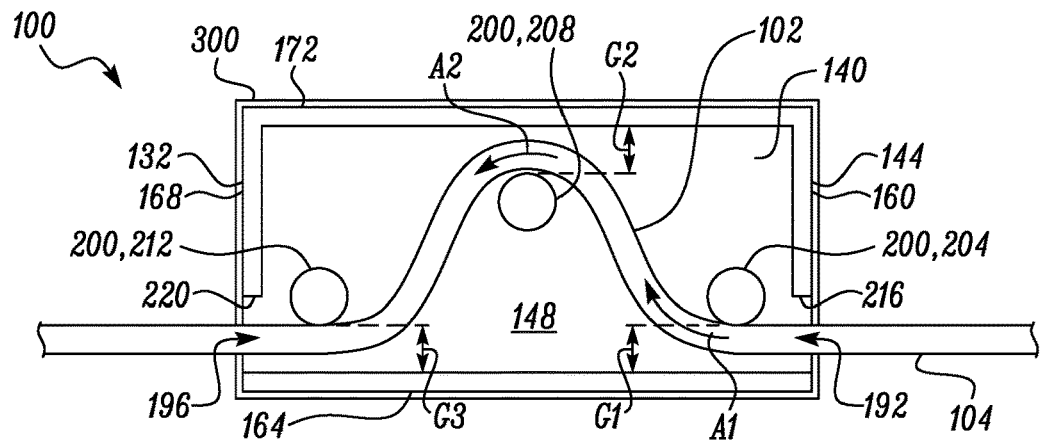

As an exemplary layout of the protrusions 204, 208, 212 on the first surface 148 of the base portion 140, the first protrusion 204 and the third protrusion 212 are both positioned closer to the second wall portion 164 than to the fourth wall portion 172. Moreover, the first protrusion 204 is positioned closer to the first wall portion 160 than to the third wall portion 168, while the third protrusion 212 is positioned closer to the third wall portion 168 than to the first wall portion 160. In that manner, the first protrusion 204 acquires a position which is relatively close to the first opening 192 than to the second opening 196 and the third protrusion 212 acquires a position which is relatively close to the second opening 196 than to the first opening 192. The second protrusion 208 is positioned closer to the fourth wall portion 172 than to the second wall portion 164, and, although not limited, the second protrusion 208 acquires a position that is generally midway between the first protrusion 204 and the third protrusion 212 and/or that is at the same distance from the first protrusion 204 and the third protrusion 212. As illustrated in FIG. 2C, a gap, G1, is defined between the first protrusion 204 and the second wall portion 164, a gap, G2, is defined between the second protrusion 208 and the fourth wall portion 172, and a gap, G3, is defined between the third protrusion 212 and the second wall portion 164.

Referring to FIG. 2C, during an application of the cable clasping device 100, the section 102 of the cable 104 is at least partially and successively wound around at least two protrusions such that one part of the section 102 is at least partially wound around one protrusion (for example, the first protrusion 204) in a first angular direction, A1, and another part of the section 102 is at least partially wound around another protrusion (for example, the second protrusion 208) in a second angular direction, A2. The first angular direction, A1, is opposite to or is in reverse to the second angular direction, A2.

More particularly, the section 102 of the cable 104 is routed into the recess 156 of the cable clasping device 100 through the first opening 192, pushed (or pressed) into the gap, G1, turned or bent in a first angular direction, A1, to reach out and be pushed (or pressed) into the gap, G2, further turned or bent (for example, in a second angular direction, A2, which is reverse or opposite to the first angular direction, A1) to reach out and be pushed (or pressed) into the gap, G3, and then finally routed out from the cable clasping device 100 through the second opening 196. In that manner, the section 102 of the cable 104 is passed into the recess 156 through the openings 192, 196 to be received into the retention structures 200. Also, the section 102 of the cable 104 is routed through the recess 156 by being at least partially wound around each of the protrusions 204, 208, 212. When the section 102 of the cable 104 is passed and/or accommodated into the recess 156, the section 102 of the cable 104 acquires at least one U-shaped or a V-shaped bend. In some embodiments, when the cable 104 includes a relatively small cross-sectional area, or, in other words, when the cable 104 is relatively thin, the cable 104 could be wound around one or more of the protrusions 204, 208, 212 completely or a number of times (that is to say 360 degrees or more) such that the retention of the section 102 of the cable 104 within the recess 156 can be more effectively attained.

In some embodiments, the first protrusion 204 and the third protrusion 212 can be omitted, and the corresponding turn or bend (for example, the first angular direction, A1) in the section 102 of the cable 104 can be induced and/or attained by making the section 102 of the cable 104 abut and turn against the corresponding edges 216, 220 (see FIG. 2C) of the first wall portion 160 and the third wall portion 168 that respectively (and partly) defines the first opening 192 and the second opening 196. Further, it will be noted that the gap, G1, between the first protrusion 204 and the second wall portion 164 and the gap, G3, between the third protrusion 212 and the second wall portion 164 are large enough to accommodate a passage of the section 102 of the cable 104 therethrough. Similarly, the gap, G2, between the second protrusion 208 and the fourth wall portion 172 is large enough to accommodate a passage of the section 102 of the cable 104 therethrough.

Figure 2D:
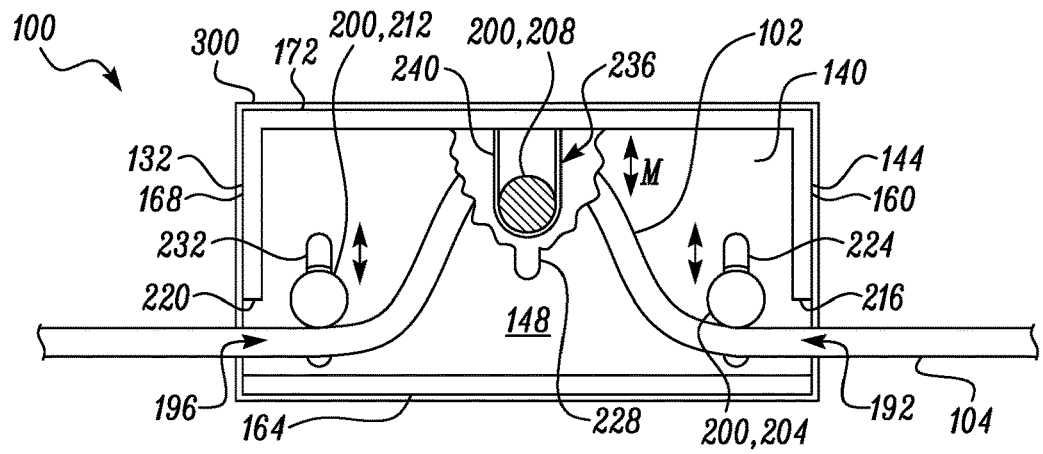
Figure 2E:
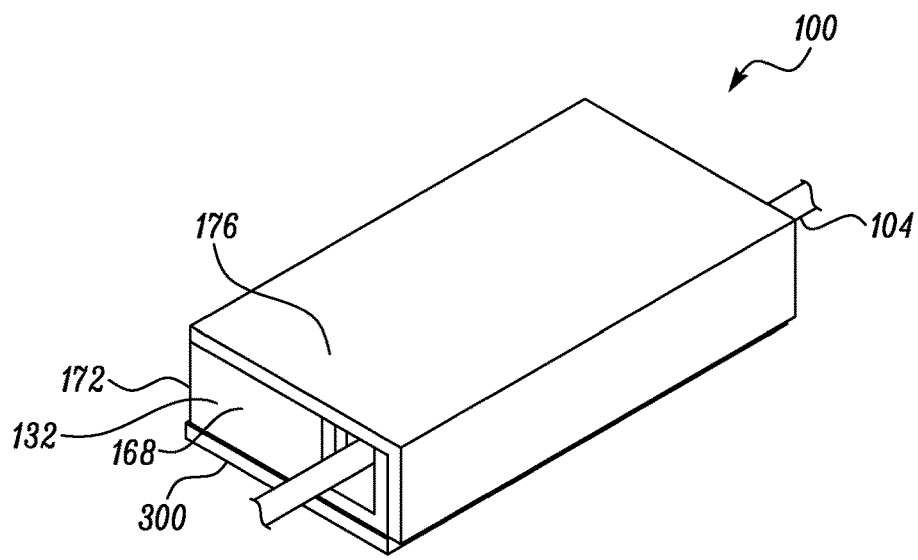

Referring to FIG. 2D, and, in some embodiments, one or more of the gaps, G1, G2, G3, are adjustable to receive varying sized cables. To enable gap adjustments, one or more of the protrusions 204, 208, 212 are configured to move (see example direction, M) on the base portion 140 to at least partially receive differently sized cables therearound. To this end, the base portion 140 can include tracks, with exemplarily, one track corresponding to or being available for one protrusion. As an example, the first protrusion 204 is guided on a first track 224, the second protrusion 208 is guided on a second track 228, and the third protrusion 212 is guided on a third track 232. The tracks 224, 228, 232 extend linearly between the second wall portion 164 and the fourth wall portion 172 and are parallel to each other. In some embodiments, the protrusions 204, 208, 212 can be retained at a desired location or position on the corresponding tracks 224, 228, 232 through a use of a fastener—the manner in which such a fastener could be applied can be contemplated by someone in the art based on the description herein and is thus not discussed.

Additionally, or optionally, the cable clasping device 100 can include a self-adjusting mechanism corresponding to each protrusion. With regard to the second protrusion 208, for example, a self-adjusting mechanism 236 is shown in FIG. 2D. The self-adjusting mechanism 236 includes an elastic band 240 that can be wound around a portion of the second protrusion 208 and which can be affixed to the fourth wall portion 172 such that as the second protrusion 208 is moved away from the fourth wall portion 172 along the length of the second track 228 or along the direction, M, the elastic band 240 is able to apply tension against said movement to pull and bias the second protrusion 208 towards the fourth wall portion 172. Similar self-adjusting mechanisms can be provided for the first protrusion 204 and the third protrusion 212, as well. Variations to such a mechanism can also be contemplated by someone skilled in art.

Referring to FIGS. 3A through 3D, exemplary variations in the structural and configurational details of the cable clasping device 100 is described. As shown, the variations mainly correspond to changes in the positions of one or more of the retention structures 200 or the protrusions 204, 208, 212 and/or the positions of the openings 192, 196. For example, in FIG. 3A, the first opening 192 and the second opening 196 are centrally positioned with respect to the first wall portion 160 and the third wall portion 168, respectively; the first protrusion 204 and the third protrusion 212 are closer to the fourth wall portion 172 than to the second wall portion 164; and the second protrusion 208 is closer to the second wall portion 164 than to the fourth wall portion 172. For example, in FIG. 3B, the first opening 192 and the second opening 196 are each closer to the second wall portion 164 than to the fourth wall portion 172; the first protrusion 204 and the third protrusion 212 are closer to the fourth wall portion 172 than to the second wall portion 164; and the second protrusion 208 is closer to the second wall portion 164 than to the fourth wall portion 172. For example, in FIG. 3C, the first opening 192 is closer to the fourth wall portion 172 than to the second wall portion 164 while the second opening 196 is closer to the second wall portion 164 than to the fourth wall portion 172; the first protrusion 204 and the third protrusion 212 are closer to the second wall portion 164 than to the fourth wall portion 172; and the second protrusion 208 is closer to the fourth wall portion 172 than to the second wall portion 164.

Figure 3A:
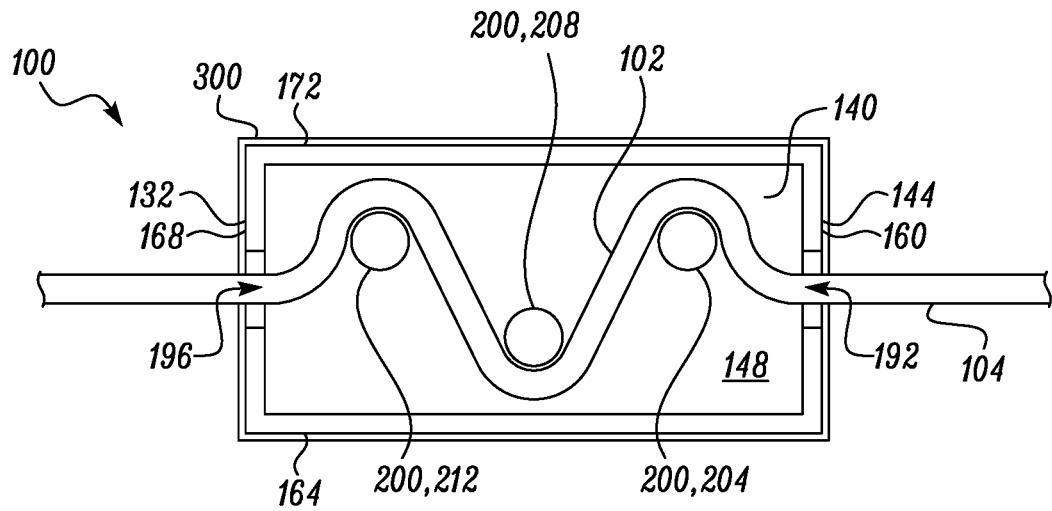
FIGS. 3A through 3D are plan views illustrating exemplary variations in the structural and configurational details of said cable clasping device of FIG. 1A, in accordance with some embodiments.
Figure 3B:
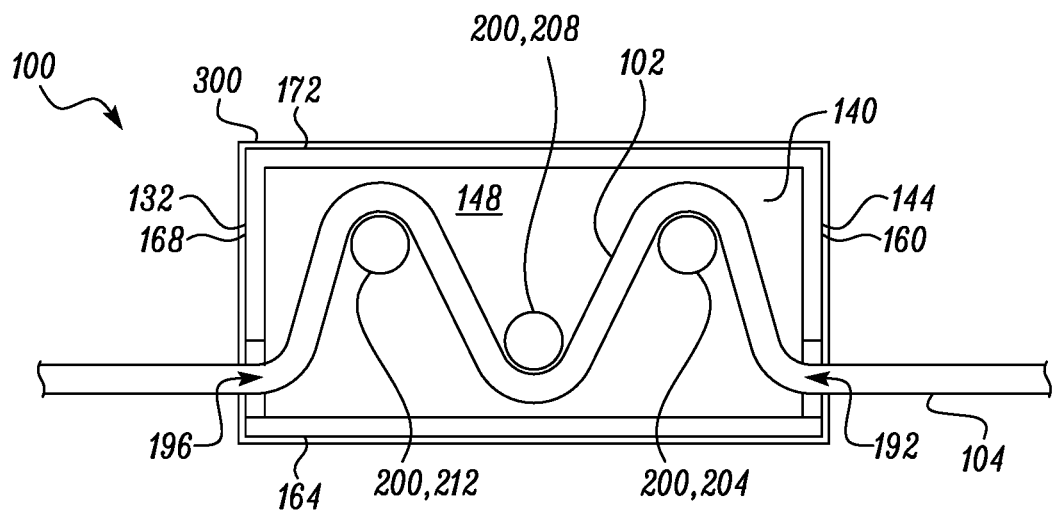
Figure 3C:
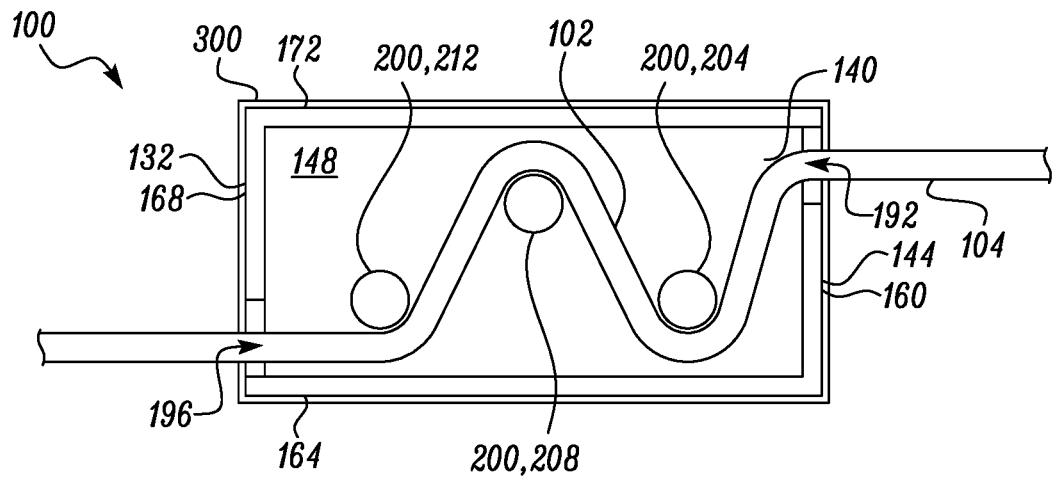
Figure 3D:
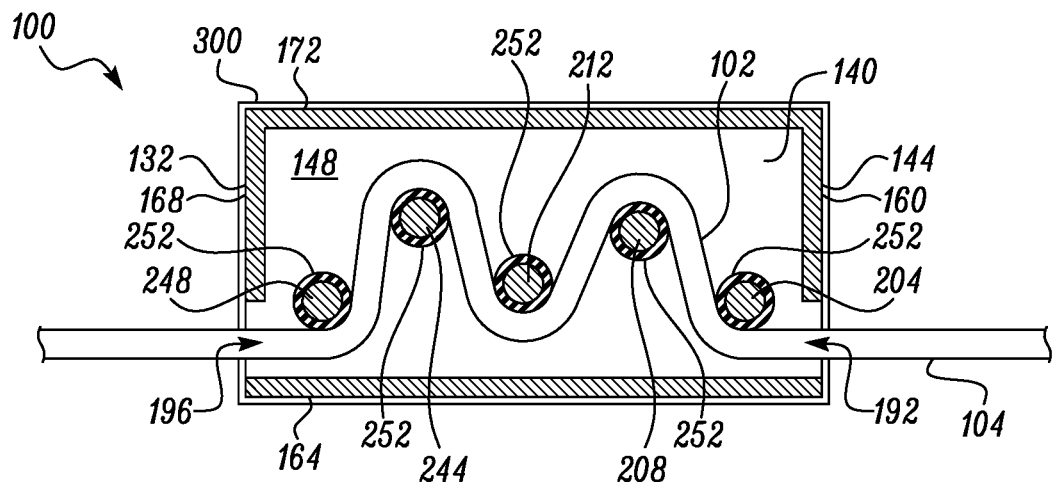

With reference to FIG. 3D, and in some embodiments, the retention structures 200 includes protrusions in addition to the first protrusion 204, the second protrusion 208, and the third protrusion 212—for example, the additional protrusions include a fourth protrusion 244 and a fifth protrusion 248. Said protrusions 244, 248 are arranged in the recess 156 and on the base portion 140 in a manner similar to the way the first protrusion 204, the second protrusion 208, and the third protrusion 212, are arranged in the recess 156 and on the base portion 140. Combinedly, the first protrusion 204, the second protrusion 208, the third protrusion 212, the fourth protrusion 244, and the fifth protrusion 248, define a serpentine pathway for the section of the cable to pass therethrough—see pathway through which the section 102 of the cable 104 is routed in FIG. 3D.

As an example, the first protrusion 204, the third protrusion 212, and the fifth protrusion 248, are all positioned closer to the second wall portion 164 than to the fourth wall portion 172, while the second protrusion 208 and the fourth protrusion 244 are positioned closer to the fourth wall portion 172 than to the second wall portion 164. Moreover, the first opening 192 and the second opening 196 are positioned closer to the second wall portion 164 than to the fourth wall portion 172. Various alternatives to the layout of the protrusions 204, 208, 212, 244, 248 and the openings 192, 196 are possible, and those that are described here are purely exemplary.

In some embodiments, one or more of the protrusions 204, 208, 212, 244, 248 includes a friction surface 252 to engage the section 102 of the cable 104 by frictional force and impede a motion (or displacement) of the section 102 of the cable 104 with respect to one or more of the protrusions 204, 208, 212, 244, 248. For example, and with reference to the cross-sectional views of the protrusions 204, 208, 212, 244, 248 in FIG. 3D, it is seen that each of the protrusions 204, 208, 212, 244, 248 (that form the many retention structures 200 of the cable clasping device 100) include the friction surface 252 (that includes a frictional outer layer, for example) interfacing and engaging with the section 102 of the cable 104 by frictional force when the cable 104 is laid into the recess 156 to pass through the pathway defined by the protrusions 204, 208, 212, 244, 248. In so doing, during application of the cable clasping device 100, the friction surface 252 disposed around each of the protrusions 204, 208, 212, 244, 248 contacts the section 102 of the cable 104 to impede a motion (or displacement) of the section 102 of the cable 104 with respect to itself and the cable clasping device 100. In some embodiments, the friction surface 252 (or the frictional outer layer) are provided only on some of the protrusions 204, 208, 212, 244, 248 and not on all of the protrusions 204, 208, 212, 244, 248. A size of the friction surface 252 or the frictional outer layer illustrated for corresponding to protrusions 204, 208, 212, 244, 248 is exaggerated for illustrative purposes.

Figure 4A:
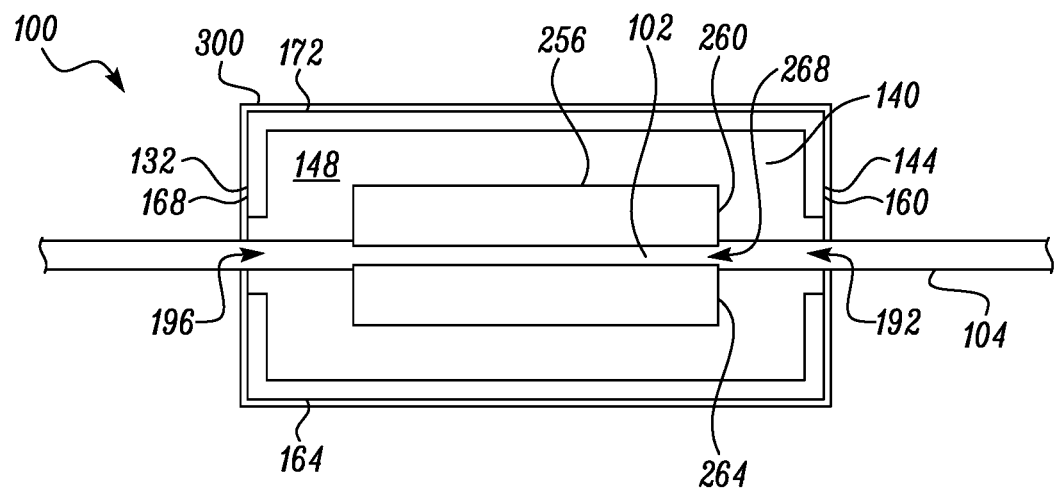
FIGS. 4A and 4B are plan views illustrating other exemplary variations in the structural and configurational details of said cable clasping device of FIG. 1A, in accordance with some embodiments.
Figure 4B:
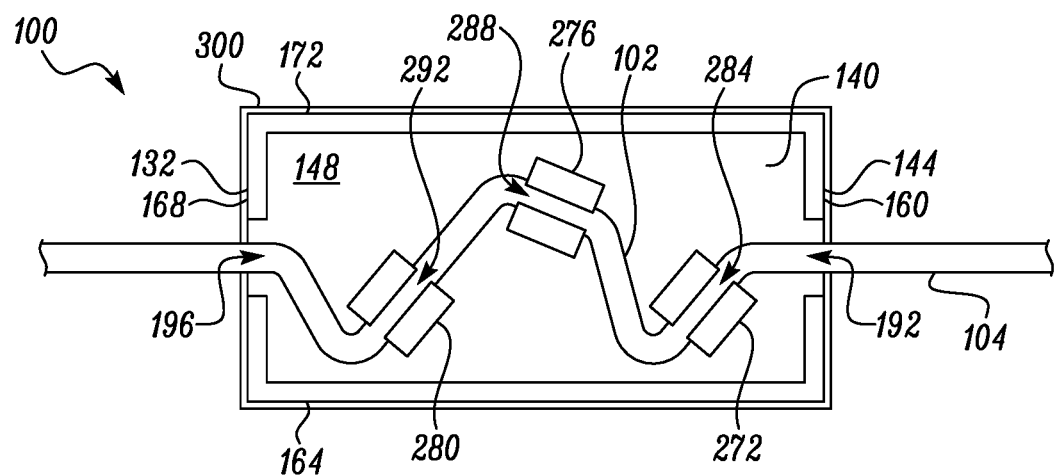
Figure 5A:
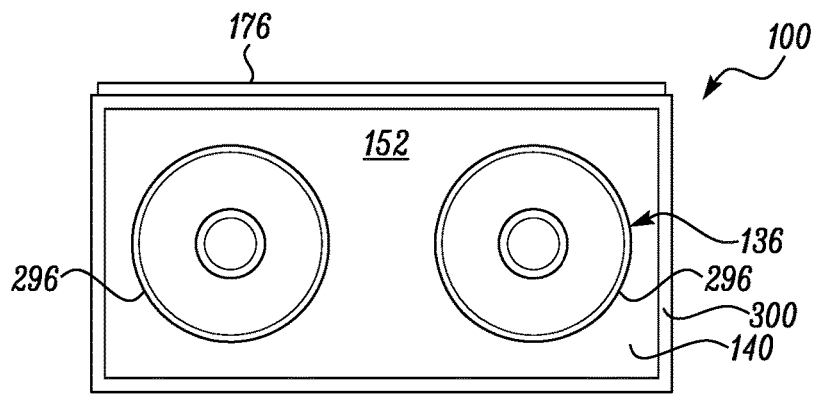
FIGS. 5A through 5D are isometric views that illustrate an exemplary mounting system of the cable clasping device of FIG. 1A, in accordance with some embodiments.
Figure 5B:
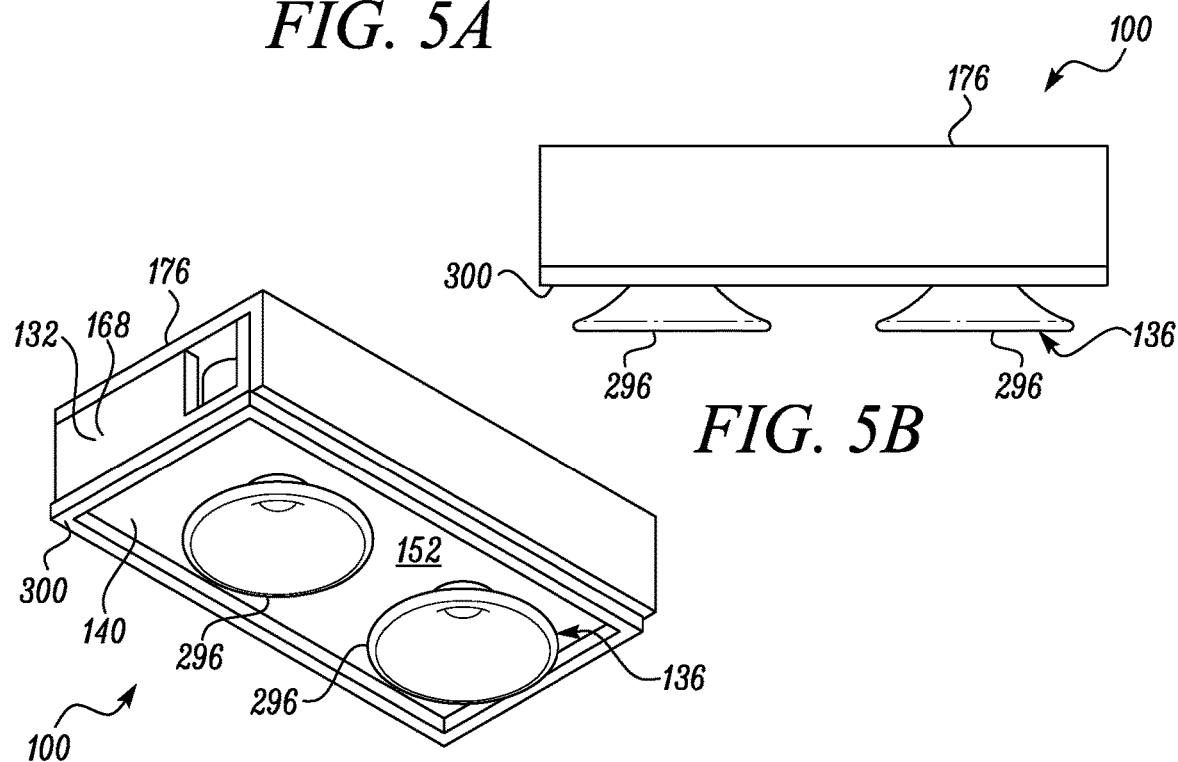
Figure 5C:
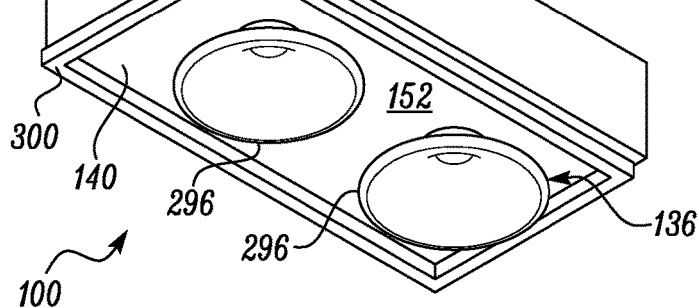
Figure 5D:
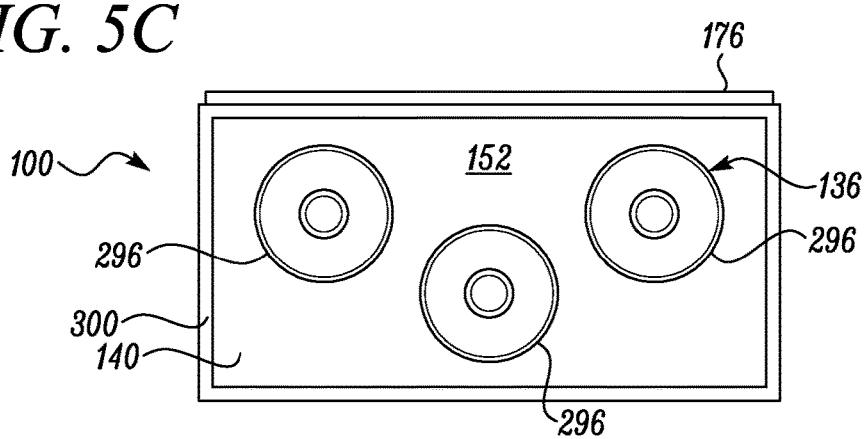

Referring to FIGS. 4A and 4B, certain exemplary variations to the retention structures 200 of the cable clasping device 100 is described. For example, the retention structures 200 include one or more teeth assemblies instead of any of the protrusions 204, 208, 212, 244, 248. Teeth assemblies can correspond to one or more assemblies each of which includes at least two mutually spaced apart jaws or teeth members that can move away from each other when the section 102 of the cable 104 is pushed into a space or a receptacle defined between them. In so doing, the jaws or teeth assemblies move away from a default state to an expanded state in which they receive the section 102 of the cable 104 into the space or the receptacle. Once the section 102 of the cable 104 is received into the space or the receptacle, the jaws or teeth members can return to their default state from the expanded state.

With reference to FIG. 4A, for example, the cable clasping device 100 includes one teeth assembly 256. Said teeth assembly 256 includes a set of flexible teeth members 260, 264 and a receptacle 268 accessible through the set of flexible teeth members 260, 264. In such a case, the section 102 of the cable 104 is configured to be pushed and snap-fitted into the receptacle 268 through the set of flexible teeth members 260, 264 to retentively secure and lock the section 102 of the cable 104 with the body 132.

As shown, the receptacle 268 exemplarily provides a linear pathway to the section 102 of the cable 104 to linearly route the cable 104 therethrough (see pathway through which the section 102 of the cable 104 is routed in FIG. 4A). This is unlike the non-linear pathway defined by the protrusions 204, 208, 212, 244, 248 in FIGS. 2A through 3D. Nevertheless, it is possible for the receptacle 268 to define a non-linear pathway to non-linearly route the section 102 of the cable 104 therethrough and/or for the teeth assembly 256 or the receptacle 268 to be oriented differently (than the orientation depicted in FIG. 4A) such that said orientation of the teeth assembly 256 or the receptacle 268 causes the section 102 to acquire one or more bends to non-linearly route the section 102 of the cable 104 therethrough.

With reference to FIG. 4B, the cable clasping device 100 includes multiple teeth assemblies. For example, the multiple teeth assemblies correspond to a first teeth assembly 272, a second teeth assembly 276, and a third teeth assembly 280. Each of the first teeth assembly 272, the second teeth assembly 276, and the third teeth assembly 280, are similar to the teeth assembly 256 of FIG. 4A and defines corresponding receptacles 284, 288, 292 which are similar to the receptacle 268. However, the first teeth assembly 272, the second teeth assembly 276, and the third teeth assembly 280 are oriented differently with respect to each other such that when the section 102 of the cable 104 is received into the corresponding receptacles 284, 288, 292 of the first teeth assembly 272, the second teeth assembly 276, and the third teeth assembly 280, at least one bend is induced in the section 102 of the cable 104. More particularly, by way of differently orienting the teeth assemblies 272, 276, 280 a non-linear pathway for the section 102 of the cable 104 is defined when the section 102 of the cable 104 is received into the receptacles 284, 288, 292 of the teeth assemblies 272, 276, 280. In some embodiments, the teeth assembly 256 and/or the teeth assemblies 272, 276, 280 can be provided along with one or more of the protrusions 204, 208, 212, 244, 248 which are described in conjunction with FIGS. 2A through 3D.

Various parts and features associated with the body 132 of the cable clasping device 100, such as the retention structures 200, wall portion 144, gate portion 176, and the base portion 140 described above, can be made from one or more of a metal, a plastic, and/or a polymer. In some embodiments, the body 132 and the retention structures 200 can be formed integrally by casting a suitable material or an alloy in a single mold. Alternatively, the retention structures 200 (for example, the protrusions 204, 208, 212 and/or the teeth assemblies 256, 272, 276, 280) are separable from the rest of the body 132 such that the retention structures 200 can be assembled and/or disassembled with respect to the base portion 140, as and when needed. For example, a coupling between the retention structures 200 and the base portion 140 can be attained threadably or through a snap-fit connection or any other connection means now known or in the future developed.

Referring to FIGS. 5A through 5D, details associated with various embodiments of the mounting system 136 are described. The mounting system 136 is configured to mount the body 132 against the surface 116 to retain the section 102 of the cable 104 against the surface 116. As shown, the mounting system 136 includes one or more suction members 296. The suction members 296 are coupled to the body 132 (for example, fixedly coupled to the second surface 152 of the base portion 140 of the body 132) and includes suctions heads that are engageable with the surface 116 by an application of a suction force to retain the body 132 removably against the surface 116. As an example, the suction members 296 are in the form of or correspond to suction cups that when pressed against the surface 116 can be retained to the surface 116. Further, the suction members can be provided in any number—for example, two suction members 296 can be provided (see FIG. 5A, 5B, 5C) or three suction members 296 can be provided (see FIG. 5D), or a lesser or a higher number of suction members 296 can be provided on the second surface 152 of the base portion 140.

With continued reference to FIGS. 5A through 5D, the body 132 also defines a lip 300 extending outwardly from the second surface 152 of the base portion 140 of the body 132. In some embodiments, the lip 300 extends orthogonally and outwardly from the second surface 152 of the base portion 140 of the body 132, although the lip 300 can extend angularly with respect to the second surface 152. As shown, the lip 300 is defined peripherally around the second surface 152. During applications, when the cable clasping device 100 is pushed against the surface 116 to allow the suction members 296 to engage with the surface 116 and retain the body 132 against the surface 116, the lip 300 is moved towards the surface 116 to at least partially screen or cover the mounting system 136 from the outside. In some embodiments, the lip 300 sits flush with the surface 116 when the cable clasping device 100 is pushed against the surface 116 and the suction members 296 are in engagement with the surface 116.

Figure 6A:
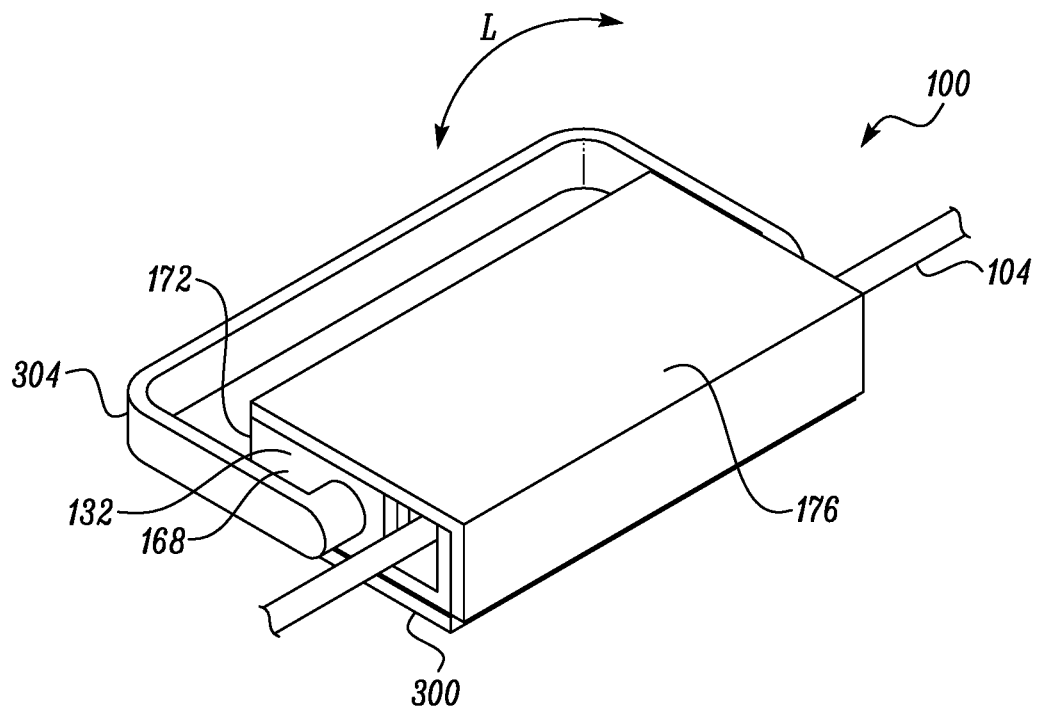
FIGS. 6A and 6B are views of an exemplary lever applicable with the exemplary mounting systems of FIGS. 5A through 5D, in accordance with some embodiments.
Figure 6B:
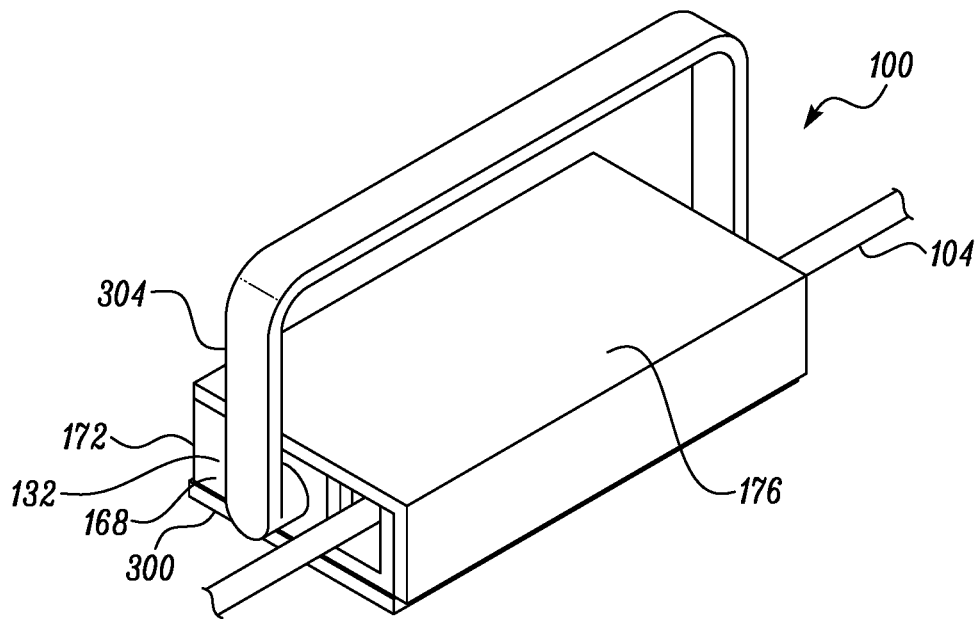

Referring to FIGS. 6A and 6B, and in some embodiments, the mounting system 136 of the cable clasping device 100 includes a lever 304. The lever 304 is movable (see direction, L) to a first position (see FIG. 6A) and to a second position (see FIG. 6B). In the first position, the lever 304 applies the suction force to enable the suction members 296 and thus the body 132 to engage and be retained with the surface 116, and, in the second position, the lever 304 releases the suction force to release the suction members 296 and the body 132 from the surface 116. In some embodiments, the function of the lever 304 can be performed by the gate portion 176, and, in such a case, when the gate portion 176 is moved to the closed state (see FIG. 2E), the suction force is applied, and when the gate portion 176 is moved to the opened state (see FIGS. 2A and 2B), the suction force is released.

Figure 7A:
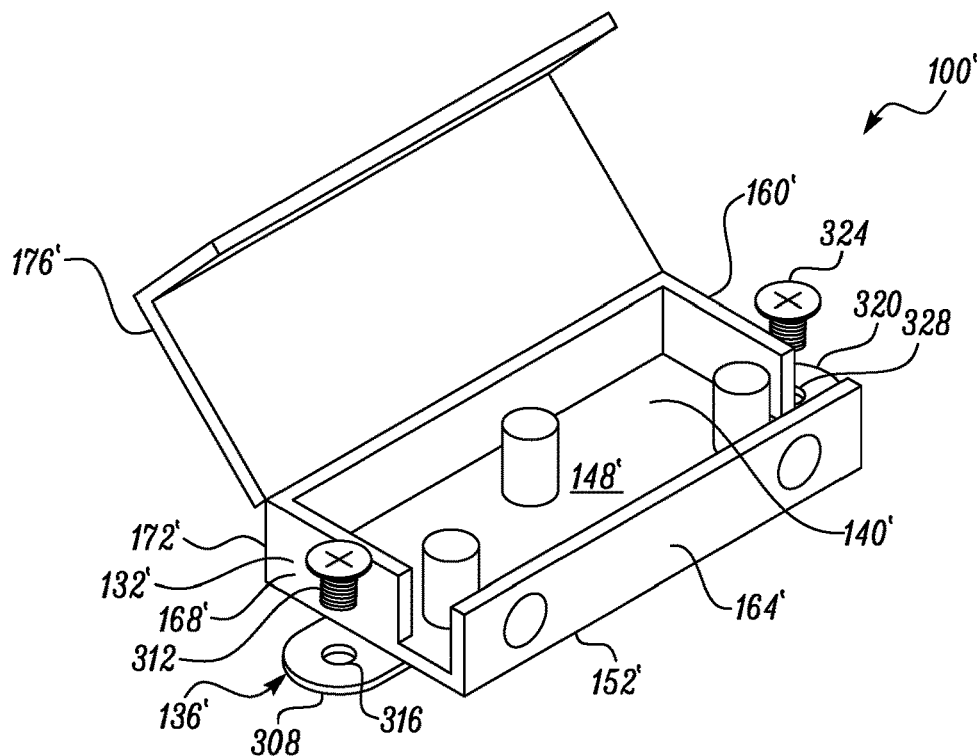
FIGS. 7A and 7B are views of another exemplary mounting system applicable with the cable clasping device of FIG. 1B, in accordance with some embodiments.
Figure 7B:
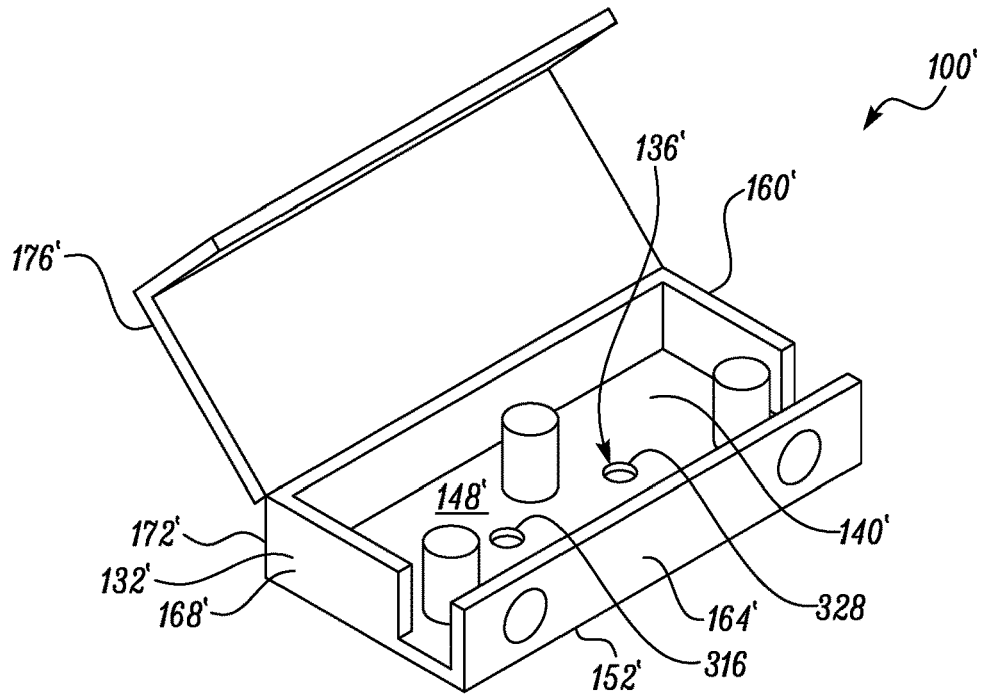

Referring to FIGS. 7A and 7B, the cable clasping device 100' is described. The description associated with the cable clasping device 100 is applicable to the cable clasping device 100' as well, with the exception that the cable clasping device 100' includes a mounting system 136' that differs from the mounting system 136 of the cable clasping device 100. In some embodiments, it is possible for the cable clasping devices 100' to include the mounting systems 136, along with the mounting system 136', as well. Therefore, the entire set of FIGS. from 2A to 6B can be equitably applicable to cable clasping device 100', as well. Moreover, the mounting systems 136, 136' are exemplary embodiments and variations to said mounting systems 136, 136' can be contemplated by someone skilled in the art.

Same or similar reference numerals are used for the same or like parts. For example, the cable clasping device 100' includes a body 132' which is similar to the body 132 of the cable clasping device 100. Similar to the description of the body 132, the body 132' defines a base portion 140' having a first surface 148' and a second surface 152'. Moreover, the body 132' defines a first wall portion 160', a second wall portion 164', a third wall portion 168', and a fourth wall portion 172', that are correspondingly similar to the first wall portion 160, the second wall portion 164, the third wall portion 168, and the fourth wall portion 172 associated with the body 132 of the cable clasping device 100.

With regard to the mounting system 136' of the cable clasping device 100', the mounting system 136' includes a plate 308 and one or more fasteners (for example, see fastener 312). The plate 308 is coupled to the body 132 and the fastener 312 is drivable through each of the plate 308 (for example, through a hole 316 in the plate 308) and the surface 116' to mount and retain the body 132 fixedly against the surface 116' (see FIG. 1B). As an example, the plate 308 extends outwards of the third wall portion 168' of the body 132', in and along a plane defined by the second surface 152' of the base portion 140', as shown.

A plate 320 (similar to the plate 308) is available, and the same extends outwards of the first wall portion 160', in and along the plane defined by the second surface 152' of the base portion 140'. A fastener 324, which is similar to the fastener 312, is drivable through the plate 320 (for example, through a hole 328 in the plate 320) and the surface 116' so as to mount and retain the body 132' fixedly against the surface 116'.

Optionally, and with reference to FIG. 7B, the holes 316, 328 are provided within the base portion 140' and the same extends from the first surface 148' of the base portion 140' to the second surface 152' of the base portion 140' to allow the fasteners 312, 324 to be driven through the base portion 140' to mount and retain the body 132' fixedly against the surface 116'. In such a case, the plates 308, 320 can be omitted.

Based on the description above, it will be appreciated that the cable clasping devices 100, 100' ensure that cables 104, 104' extending from apparatuses 108, 108' are securely retained at a user desired position on a surface. Also, the cable clasping devices 100, 100' prevent displacement of the cables 104, 104' and damage that can occur to the apparatuses 108, 108' when distal cable portions 124, 124' are disturbed or mishandled. It will be also understood that the cable clasping devices 100, 100' can be applied to receive a variety of other elongated articles or elongated items that are similar in shape and/or profile to a cable, such as a lanyard, a rope, a cord, a string, and the like. Accordingly, it will be understood that the applications of the cable clasping devices 100, 100' along with the apparatuses 108, 108' described herein are purely exemplary.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the description. This method is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

I claim:
1. A cable clasping device, comprising:
  a body defining one or more retention structures configured to receive a section of a cable to retentively secure and lock the section of the cable with respect to the body,
    wherein the body defines a base portion and a wall portion at least partly surrounding the base portion to define a recess within the body, the one or more retention structures being arranged within the recess and including one or more protrusions extending from the base portion, the section of the cable is configured to be routed through the recess by being at least partially wound around each of the one or more protrusions;
  a self-adjusting mechanism including an elastic band wound around the at least one protrusion of the one or more protrusions, the elastic band affixed to the wall portion such that as the at least one protrusion is moved away from the wall portion to at least partially receive differently sized cables therearound, the elastic band applies tension to pull and bias the at least one protrusion towards the wall portion; and
  a mounting system configured to mount the body against a surface to retain the section of the cable against the surface.

2. The cable clasping device of claim 1, wherein the mounting system includes a plate and one or more fasteners, the plate being coupled to the body and the one or more fasteners being drivable through each of the plate and the surface to retain the body fixedly against the surface.

3. The cable clasping device of claim 1, wherein the one or more retention structures define a non-linear pathway to receive the section of the cable therethrough.

4. The cable clasping device of claim 3, wherein the non-linear pathway includes a zig-zag pathway.

5. The cable clasping device of claim 3, wherein the non-linear pathway enables the section of the cable to acquire one or more bends when the section of the cable is received into the non-linear pathway, the one or more bends causing the section of the cable to be retentively secured and locked with respect to the body.

6. The cable clasping device of claim 1, wherein the base portion defines a first surface and a second surface opposite to the first surface, the one or more retention structures being arranged on the first surface and the mounting system being arranged on the second surface.

7. The cable clasping device of claim 1 further including a gate portion pivotably coupled to the body to be moved to enclose the section of the cable within the recess.

8. The cable clasping device of claim 7, wherein the body defines one or more openings in one or more of the base portion, the wall portion, and the gate portion, such that the section of the cable is passable into the recess through the one or more openings to be received into the one or more retention structures.

9. The cable clasping device of claim 1, wherein the section of the cable is at least partially and successively wound around at least two protrusions of the one or more protrusions such that a first part of the section is at least partially wound around a first protrusion of the at least two protrusions in a first angular direction and a second part of the section is at least partially wound around a second protrusion of the at least two protrusions in a second angular direction, the first angular direction being opposite to the second angular direction.

10. The cable clasping device of claim 1, wherein the one or more protrusions are arrayed in at least one of a zig-zag manner and an irregular manner on the base portion.

* * * * *